(12) United States Patent
Hattangady et al.

(10) Patent No.: US 6,399,445 B1
(45) Date of Patent: Jun. 4, 2002

(54) FABRICATION TECHNIQUE FOR CONTROLLED INCORPORATION OF NITROGEN IN GATE DIELECTRIC

(75) Inventors: Sunil V. Hattangady, McKinney; Srikanth Krishnan; Robert Kraft, both of Plano, all of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/212,508

(22) Filed: Dec. 15, 1998

Related U.S. Application Data

(60) Provisional application No. 60/068,014, filed on Dec. 18, 1997.

(51) Int. Cl.[7] .............................................. H01L 21/336
(52) U.S. Cl. ...................... 438/261; 257/411; 257/413
(58) Field of Search ........................... 257/44, 410, 413; 438/775, 776, 777, 585, 587, 588, 761

(56) References Cited

U.S. PATENT DOCUMENTS

| 4,243,855 | A | * | 1/1981 | Saxena | 438/776 |
|---|---|---|---|---|---|
| 4,575,925 | A | * | 3/1986 | Kambara | 29/578 |
| 5,254,208 | A | * | 10/1993 | Zhang | 156/603 |
| 5,422,291 | A | | 6/1995 | Clementi et al. | 437/43 |
| 5,464,792 | A | * | 11/1995 | Tseng | 437/160 |
| 5,614,026 | A | | 3/1997 | Williams | 118/723 |
| 5,674,788 | A | * | 10/1997 | Wrister | 437/239 |
| 5,712,177 | A | | 1/1998 | Kaushik et al. | 437/42 |
| 5,773,325 | A | * | 6/1998 | Teramoto | 438/151 |
| 5,830,332 | A | * | 11/1998 | Babich | 216/12 |
| 5,885,870 | A | | 3/1999 | Maiti et al. | 438/261 |
| 5,891,793 | A | | 4/1999 | Gardner et al. | 438/585 |
| 5,960,302 | A | | 9/1999 | Ma et al. | 438/585 |
| 6,087,229 | A | | 7/2000 | Aronowitz et al. | 438/287 |
| 6,162,687 | A | | 12/2000 | Gardner et al. | 438/287 |
| 6,187,633 | B1 | | 2/2001 | Dong et al. | 438/261 |

FOREIGN PATENT DOCUMENTS

| EP | 0 488 393 | 6/1992 | ............ H01J/37/32 |
|---|---|---|---|
| EP | 0 824 268 | 2/1998 | ........... H01L/21/28 |
| EP | 0 847 079 | 6/1998 | ........... H01L/21/28 |
| EP | 0 926 710 | 6/1999 | ........... H01L/21/28 |
| JP | 241269 | 10/1985 | ........... G01R/19/04 |
| TW | 278 230 | 9/1984 | ......... H01L/27/105 |

OTHER PUBLICATIONS a P+ Poly–Si Gate with Nitrogen–Doped Poly–Si Layer for Deep Submicron PMOSFET's. Wakaiya et al. Conference Washington, DC, May 10, 1991.*

(List continued on next page.)

*Primary Examiner*—Olik Chaudhuri
*Assistant Examiner*—Nathan W. Ha
(74) *Attorney, Agent, or Firm*—David Denker; Wade James Brady, III; Frederick J. Telecky, Jr.

(57) ABSTRACT

A method of fabricating a semiconductor MOS device and the device wherein there is initially provided a semiconductor substrate having a gate insulator layer thereon and intimate therewith. A region of one of a nitride or oxynitride is formed at the surface region of the layer remote from the substrate having sufficient nitride to act as a barrier against the migration of dopant therethrough to the substrate. A doped polysilicon gate or a metal gate is then formed over the region of a nitride or oxynitride. The amount of nitride in the insulator layer intimate and closely adjacent to the substrate is insufficient to materially alter the characteristics of the device being fabricated. The substrate is preferably silicon, the oxide and nitride are preferably those of silicon and the dopant preferably includes boron. The step of forming a region of one of a nitride or oxynitride includes the step of injecting neutral atomic nitrogen into the surface of the gate insulator layer surface remote from the substrate. The region of one of a nitride or oxynitride is from about 1 to about 2 monolayers.

20 Claims, 1 Drawing Sheet

OTHER PUBLICATIONS

S. V. Hattangady et al., "Controlled Nitrogen Incorporation At The Gate Oxide Surface," Applied Physics Letters, vol. 66, No. 25, Jun. 19, 1995, pp. 3495–3497.

"European Search Report: EP 98 31 0416," Aug. 20, 1999.

"Abstract (Japan): JP 60 241269," Nov. 30, 1985 (Seiko Epson Corp: Iwano Hideaki).

"Abstract (Taiwan): TW 278 230," Nat Sci Council Republic of China, Jun. 11, 1996.

* cited by examiner

FABRICATION TECHNIQUE FOR CONTROLLED INCORPORATION OF NITROGEN IN GATE DIELECTRIC

CROSS REFERENCE TO PRIOR APPLICATIONS

This application claims priority under 35 USC §119(e)(1) of provisional application No. 60/068,014 filed Dec. 18, 1997.

This application is related to Ser. No. 08/864,438, filed May 28, 1997 (TI-23502) and provisional application Serial No. 60/035,375, filed Dec. 5, 1997 (TI-22980P), the contents of both of which are incorporated herein by reference.

BACKGROUND OF THE INVENTION

1. Field of the Invention

This invention relates to fabrication of semiconductor devices arid, more specifically, to the fabrication of gate structures for MOSFET semiconductor devices and particularly PMOS semiconductor devices.

2. Brief Description of the Prior Art

Standard MOSFET semiconductor devices generally include a gate electrode separated from a channel by a dielectric or gate oxide, generally silicon dioxide. PMOS devices generally have a highly doped P-type gate electrode over an N-type doped substrate (also known as an N-well) to provide a P-channel, and NMOS devices generally have a highly doped N-type gate electrode over a P-type doped substrate (also known as a P-well) to provide an N-channel. The gate electrode is generally polysilicon and the dopant generally used for PMOS devices is boron. In the present state of the art, the most aggressive gate oxide can be as thin as about 15 Angstroms and is generally about 45 Angstroms, though it can be even thicker, the thickness of the gate oxide being dependent upon device geometry which is continually being reduced in size. The fabrication process generally involves formation of the gate oxide with formation of a patterned gate electrode over the gate oxide.

In the case of PMOS devices with boron-doped polysilicon gate electrodes, the boron has a tendency to diffuse to some extent through the gate oxide and into the channel. This boron doping in the channel causes the threshold voltage of the device to shift, this shift being undesirable. Accordingly, it is highly beneficial to provide a barrier to the diffusion of the boron into the channel. Traditional prior art approaches to this problem have been, for example, ROXNOX, which stands for reoxidized ammonia nitrided oxide, wherein the gate dielectric processing, involves application of ammonia at high temperature to the gate oxide to introduce nitrogen as a barrier to the undesirable boron diffusion. While it is a thermal process, it introduces nitrogen in high concentrations at the bottom of the gate oxide that increases fixed charge and interface-state density which degrades device performance and is therefore undesirable. A second procedure is known as $N_2O$ or NO thermal oxidation wherein nitrous oxide or nitric oxide is introduced to the gate oxide at elevated temperature with the nitrogen concentration being directly proportional to the increase in temperature. Again, this procedure is a thermal process and places nitrogen predominantly at the bottom portion of the gate oxide and in the region of the interface between the gate oxide and the channel, which degrades device performance when present in large concentrations.

In the case of CMOS devices with metal gate electrodes (e.g., W/TiN stack), interaction between the metal gate and the ultrathin oxide can pose a formidable challenge. Accordingly, it is highly beneficial to provide a nitride or oxynitride barrier to prevent detrimental metal-oxide interactions (e.g., spiking) at the top gate electrode-oxide interface.

SUMMARY OF THE INVENTION

In accordance with the present invention, the above identified problem of the prior art is minimized.

It has been determined that the undesirable properties resulting from the inclusion of nitrogen in the gate oxide results from the fact that the nitrogen is disposed in the gate oxide, but in the region of the gate oxide immediately adjacent or at the interface between the gate oxide arid the channel. Accordingly, in accordance with the present invention, the nitrogen is disposed preferably in the portion of the gate oxide remote from the channel or as a separate layer at the surface of the gate oxide remote from the channel, this barrier being at least one or two monolayers or from about 5 to about 10 Angstroms and generally as thin as possible commensurate with its purpose as a barrier to diffusion of boron into the channel. The nitride and/or oxynitride layer is formed prior to introduction of the dopant either into the gate electrode material after formation of that electrode, such as by implantation, or concurrently with the gate electrode formation, such as by CVD. An important feature of the invention is that the nitrogen species utilized in accordance with the present invention is an uncharged or neutral beam species, since it has been determined that charged particles in a plasma can potentially cause charge-induced damage which leads to degradation in gate dielectric integrity, this problem becoming more acute as device dimensions are reduced. In other words, the nitrogen introduced to the oxide surface is by chemical reaction with uncharged or neutral atomic nitrogen.

According to a first embodiment of the invention, the gate oxide of the CMOS device is initially formed by conventional thermal oxidation in oxygen, nitrous oxide, nitric oxide or any similar oxidizing gas. In the case of the nitrogen-containing oxidizing gas, a very small amount of nitrogen will be incorporated at the gate oxide/silicon substrate interface as well as elsewhere through the gate oxide, however the amount of nitrogen will be insufficient to cause any of the problems encountered in the prior art as discussed above to any significant extent while providing some of the benefits of increased gate dielectric reliability having nitrogen at the interface of the gate oxide and substrate. After the gate oxide has been formed in this manner, the gate oxide upper surface remote from the substrate is subjected to nitridation using a neutral N-beam at a temperature preferably in the range from about standard room temperature to about 300 degrees C. The neutral N-beam is produced by well known techniques, such as thermal processes, nozzles, laser ablation, adiabatic expansion and plasma techniques ill conjunction with electrostatic grid neutralizers and plate neutralizers.

According to a second embodiment, the surface of the silicon substrate is nitrided using a neutral N-beam. The neutral N-beam is produced in the same manner discussed above in connection with the first embodiment. The device is then subjected to thermal oxidation in oxygen, nitrous oxide, nitric oxide or any similar oxidizing gas, during which the nitrogen is displaced from the oxide/silicon interface and moved into the bulk of the oxide.

The CMOS device fabrication is then completed in standard manner.

In accordance with the present invention, there is controlled nitrogen incorporation at the gate oxide surface remote from the substrate. In addition, there is a low thermal budget and there is little charge-induced damage which is generally associated with plasma-based processes. Furthermore, ammonia, the hydrogen of which has been shown to be detrimental, is not used for nitrogen incorporation as in prior art procedures.

In addition, plasma processes are generally followed by an annealing step. With the use of the neutral nitrogen atom species, the annealing step is not required. Accordingly, tile additional annealing step of the prior art is eliminated.

DESCRIPTION OF THE PREFERRED EMBODIMENT

Figure 1:
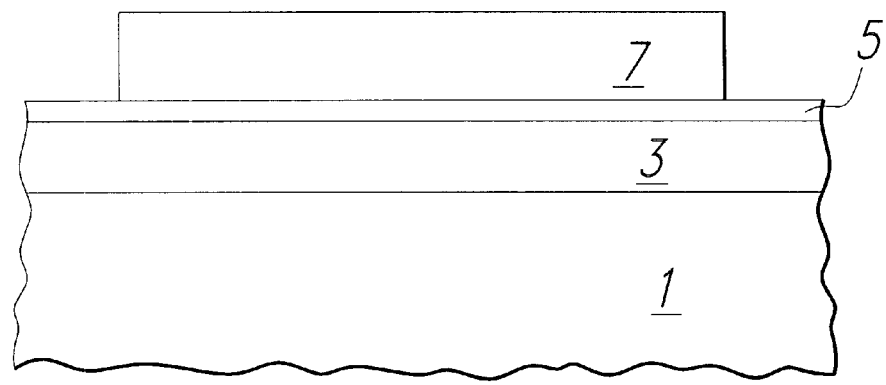
FIG. 1 is a schematic diagram of a PMOS device in accordance with the present invention.

Referring first to FIG. 1, there is shown a silicon substrate 1 over which has been formed in standard manner a layer of silicon dioxide 3 having a thickness of 10 to 30 Angstroms. Neutral atoms of nitrogen are then impinged upon the exposed surface of the silicon oxide to form a layer 5 containing either silicon nitride or a combination of silicon dioxide and silicon nitride and having a thickness of 5 to 10 Angstroms (determined from an analytical technique such as secondary ion microscopy). A doped, for example P-doped, polysilicon gate electrode 7 is then formed over the layer 5. The polysilicon gate is formed either by depositing polysilicon in standard manner and then implanting dopants, such as boron or phosphorus, therein or by CVD wherein the polysilicon and dopant are simultaneously deposited. Alternatively, the gate electrode may also be comprised of a metal gate, such as, for example, a W/TiN stack.

Figure 2:
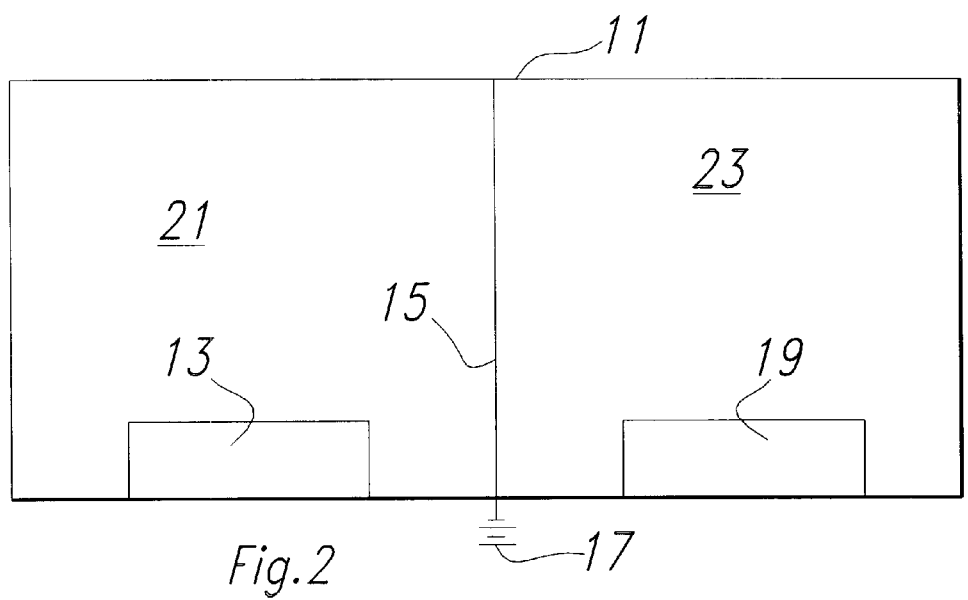
FIG. 2 is a schematic diagram of a system for providing neutral atoms of nitrogen.

With reference to FIG. 2, there is shown one of many possible systems for providing the neutral nitrogen atoms. There is shown a chamber 11 having first and second sections 21 and 23 respectively separated by a screen or baffle 15 which is negatively charged by a voltage source 17. Charged atoms of nitrogen are provided by a plasma generator 13 in the chamber section 21 and pass through the negatively charged screen 15 to the chamber section 23. The charged atoms lose their charge reflecting off the screen or making charge exchange collisions with neutrals. These neutralized atoms react with the exposed silicon dioxide surface of the device 19 being fabricated to convert that surface from an oxide to a nitride or oxynitride. The depth of the nitride or oxynitride layer depends upon the energy of neutral nitrogen impinging upon the surface. The concentration of nitrogen in the nitride or oxynitride layer depends upon the flux of neutral nitrogen impinging upon the surface. The plasma can be operated at temperatures in the range of standard room temperature up to about 600 degrees C.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating a semiconductor MOS device which comprises the steps of:
   (a) providing a semiconductor substrate having a gate insulator layer thereon and intimate therewith;
   (b) forming a region of one of a nitride or oxynitride at the surface region of said insulator layer remote from said substrate having sufficient nitride to act as a barrier against the migration of dopant therethrough to said substrate; and
   (c) then forming one of a doped polysilicon or metal gate over said region.

2. The method of claim 1 wherein the amount of said nitride in said insulator layer intimate and closely adjacent to said substrate is insufficient to significantly degrade the fixed charge and interface-state density characteristics of said device being fabricated.

3. The method of claim 1 wherein said substrate is silicon, said oxide and nitride are those of silicon and said dopant includes boron.

4. The method of claim 2 wherein said substrate is silicon, said oxide and nitride are those of silicon and said dopant includes boron.

5. The method of claim 1 wherein said step of forming a region of one of a nitride or oxynitride includes the step of injecting neutral atomic nitrogen into the surface of said gate insulator layer surface remote from said substrate.

6. The method of claim 2 wherein said step of forming a region of one of a nitride or oxynitride includes the step of injecting neutral atomic nitrogen into the surface of said gate insulator layer surface remote from said substrate.

7. The method of claim 3 wherein said step of forming a region of one of a nitride or oxynitride includes the step of injecting neutral atomic nitrogen into the surface of said gate insulator layer surface remote from said substrate.

8. The method of claim 4 wherein said step of forming a region of one of a nitride or oxynitride includes the step of injecting neutral atomic nitrogen into the surface of said gate insulator layer surface remote from said substrate.

9. The method of claim 1 wherein said region of one of a nitride or oxynitride is from about 1 to about 2 monolayers.

10. The method of claim 2 wherein said region of one of a nitride or oxynitride is from about 1 to about 2 monolayers.

11. The method of claim 4 wherein said region of one of a nitride or oxynitride is from about 1 to about 2 monolayers.

12. The method of claim 8 wherein said region of one of a nitride or oxynitride is from about 1 to about 2 monolayers.

13. A method of fabricating a semiconductor MOS device, the method comprising the steps of:
   (a) providing a semiconductor substrate having a gate insulator layer thereon and intimate therewith;
   (b) forming a region of one of a nitride or oxynitride proximate the surface of said insulator layer remote from said substrate, said region having sufficient nitride to act as a barrier against the migration of dopant therethrough to said substrate,
   wherein said region is within said insulator layer and the nitride concentration of the region is substantially greater than the nitride concentration of said insulator layer closely adjacent said substrate; and
   (c) then forming one of a doped polysilicon or metal gate over said region.

14. The method of claim 13 wherein the amount of said nitride in said insulator layer intimate and closely adjacent to said substrate is insufficient to significantly degrade the fixed charge and interface-state density characteristics of said device being fabricated.

15. The method of claim 14 wherein said substrate is silicon, said oxide and nitride are those of silicon and said dopant includes boron.

16. The method of claim 15 wherein said step of forming a region of one of a nitride or oxynitride includes the step of injecting neutral atomic nitrogen into the surface of said gate insulator layer surface remote from said substrate.

17. The method of claim 14 wherein said step of forming a region of one of a nitride or oxynitride includes the step of injecting neutral atomic nitrogen into the surface of said gate insulator layer surface remote from said substrate.

18. The method of claim 17 wherein said step of forming a region of one of a nitride or oxynitride does not comprise exposure to a hydrogen-bearing gas.

19. The method of claim 13 wherein said step of forming a region of one of a nitride or oxynitride does not comprise exposure to a hydrogen-bearing gas.

20. The method of claim 13 wherein said region of one of a nitride or oxynitride is from about 1 to about 2 monolayers.

* * * * *